(12) United States Patent
Grosser

(10) Patent No.: US 10,191,508 B2
(45) Date of Patent: Jan. 29, 2019

(54) PERIPHERAL MODULE AND CIRCUIT ARRANGEMENT FOR A DIGITAL INPUT OF THE PERIPHERAL MODULE

(71) Applicant: Siemens Aktiengesellschaft, Munich (DE)

(72) Inventor: Stefan Grosser, Schnaittenbach (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 15/833,507

(22) Filed: Dec. 6, 2017

(65) Prior Publication Data

US 2018/0164844 A1   Jun. 14, 2018

(30) Foreign Application Priority Data

Dec. 8, 2016   (EP) ..................................... 16202933

(51) Int. Cl.
| | |
|---|---|
| *G05F 5/00* | (2006.01) |
| *G01R 19/165* | (2006.01) |
| *G05B 19/05* | (2006.01) |
| *G06F 13/00* | (2006.01) |

(52) U.S. Cl.
CPC ............. *G05F 5/00* (2013.01); *G01R 19/165* (2013.01); *G05B 19/05* (2013.01); *G06F 13/00* (2013.01)

(58) Field of Classification Search
CPC . G06F 13/4072; G01R 31/31716; G05F 5/00; G05F 3/08; H02M 3/155
USPC ......... 710/310–315; 323/222, 224, 271, 273, 323/282–290, 299
See application file for complete search history.

(56) References Cited

U.S. PATENT DOCUMENTS

| | | | | |
|---|---|---|---|---|
| 6,285,017 | B1 * | 9/2001 | Brickell | .................. G01S 7/486 250/214 A |
| 7,002,783 | B2 * | 2/2006 | Lee | ......................... H02H 3/20 361/91.3 |
| 7,894,219 | B2 * | 2/2011 | Zong | ....................... H02M 1/36 363/21.16 |
| 8,441,210 | B2 * | 5/2013 | Shteynberg | ........ H05B 33/0815 315/209 R |
| 8,629,631 | B1 * | 1/2014 | Rhodes | ................... H02M 1/36 315/227 R |

(Continued)

FOREIGN PATENT DOCUMENTS

| | | |
|---|---|---|
| EP | 1770456 | 4/2007 |
| EP | 1770457 | 4/2007 |

*Primary Examiner* — Rajnikant Patel
(74) *Attorney, Agent, or Firm* — Cozen O'Connor

(57) ABSTRACT

A circuit arrangement for a digital input of an electronic peripheral module includes an inlet connection forming a digital input, a ground connection, a semiconductor switching device arranged between the inlet connection and the ground connection to limit input current and a reference voltage source connected to a control input of the semiconductor switching device to control the device, wherein a regulator which, depending on an input voltage at the inlet connection, regulates the reference voltage source such that the semiconductor switching device, for a first voltage value, adjusts the input current for the input voltage to a first input current and, for a second voltage value, adjusts the input current for the input voltage to a second input current, wherein the first voltage value is greater than the second voltage value and the first input current is smaller than the second input current on account of the regulator.

7 Claims, 9 Drawing Sheets

(56) References Cited

U.S. PATENT DOCUMENTS

| | | |
|---|---|---|
| 9,787,185 B2 * | 10/2017 | Lo Iacono ............ H02M 3/156 |
| 2007/0069590 A1 | 3/2007 | Engl et al. |
| 2007/0094434 A1 | 4/2007 | Engl et al. |

* cited by examiner

PERIPHERAL MODULE AND CIRCUIT ARRANGEMENT FOR A DIGITAL INPUT OF THE PERIPHERAL MODULE

BACKGROUND OF THE INVENTION

1. Field of the Invention

The invention relates to a circuit arrangement for a digital input of a peripheral module, comprising an inlet connection acting as a digital input, a ground connection, where a semiconductor switching device is arranged between the inlet connection and the ground connection to limit the input current, and a reference voltage source is connected to a control input of the semiconductor switching device to control the semiconductor switching device.

The invention also relates to a peripheral module for an automation device having the aforementioned circuit arrangement.

Within the meaning of the invention, each assembly or each module in or for an automation device which is designed and intended for the connection of external peripherals is designated as a peripheral module, hence, for example, sensors.

2. Description of the Related Art

Automation devices are generally known, in particular in an embodiment as modular automation devices, such as in the form of automation devices that are supplied by the applicant under the SIMATIC brand. From these automation devices, peripheral modules also designed as individual modules, in particular, input modules or combined input/output modules, are also known as a specific example of a peripheral module.

The invention relates especially to a circuit arrangement with at least one inlet connection acting as a digital input for a peripheral module. Such a circuit arrangement or such a peripheral module is accordingly a peripheral module with digital input functionality. Such modules are frequently designed with a plurality of, for example, 16 or 32 digital inputs and accordingly designated as digital input modules. The digital input module is therefore a special form of a peripheral module with solely digital input functionality. In addition, hybrid forms may also have, e.g., digital input/output modules or digital input and analog input modules with at least one digital input.

The conventional digital input modules are based on the principle that, with an activated, connected sensor, a current flows into the module by way of a digital input, i.e., the input channel linked to the inlet connection. In the simplest case, with an existing current flow the sensor is detected as activated. Correspondingly, if there is no existing current flow the sensor is detected as deactivated. However, a current can also flow into the module when a sensor is deactivated such that the status of the sensor is customarily detected at the level of a voltage, preferably based on exceeding certain predetermined or predeterminable threshold values for the voltage level necessary to conduct a current over the inlet connection. This standard principle is not entirely ideal insofar as a power loss occurs within the module as a result of the input current. With predetermined standards, according to International Electrotechnical Commission (IEC) 61131-2, for voltage and current values on digital inputs (Type 1: high signal in the voltage range 15 V to 30 V, input current for high signal: At least 2 mA; Type 2: high signal in the voltage range 11 V to 30 V, input current for high signal: 6 mA), the power loss on an input channel of the aforementioned second type is at least 30 V·6 mA=180 mW. The power loss varies according to the electrical circuitry of the input channel. In the case of an input channel realized via a passive circuit, there is a power loss of 30 V·16.4 mA=492 mW. The preceding numerical example (power loss: 180 mW) relates to an active circuit with current sink".

In addition, the above exemplified power loss occurs per input channel. That is, for an assembly with 32 input channels, the power loss amounts to 32 V·180 mW=5.76 W or 32 V·492 mW=15.74 W.

The peripheral modules described, their circuit arrangement, and the attendant problems as described are already known from the European patent applications EP 1 770 456 A1 and EP 1 770 457 A1.

With the small dimensions of current Programmable Logic Controller (PLC) systems or automation devices, power losses like those arising in Type 2 digital inputs cannot be dissipated. A digital input according to the standard IEC 61131-2: 2007 Type 3 is therefore used. Type 3: high level at $>=11$ V (current consumption $>=2$ mA), low level at $<=5$ V.

Therefore, the fundamental problem that digital inputs produce a power loss is solved by the current consumption being reduced as much as the standard concerned permits (EN 61131-2). However, reduced current consumption in turn results in any existing line capacities being only slowly discharged with this reduced current. The line capacities arise from the connection cables routed between a peripheral module and the sensor. The reduced discharge of the line capacities results in the problem of a maximum switching or signal frequency being limited thereby.

SUMMARY OF THE INVENTION

In view of the foregoing, it is therefore an object of the invention to reduce a power loss accruing on the module side but, nevertheless, still be able to discharge any existing line capacities rapidly enough.

This and other objects and advantages are achieved in accordance with the invention by a circuit arrangement for a digital input of a peripheral module, where this circuit arrangement includes an inlet connection forming a digital input, a ground connection, a semiconductor switching device arranged between the inlet connection and the ground connection to limit at an input current, and a reference voltage source which is connected to a control input of the semiconductor switching device to control the semiconductor switching device, while at the same time there is a regulator that is configured, depending on the input voltage on the inlet connection, to regulate the reference voltage source such that, with a first voltage value for the input voltage, the prime conductor switching device adjusts the input current to a first input current and with a second voltage value for the input voltage adjusts the input current to a second input current, where the first voltage value is greater than the second voltage value and due to the regulator the first input current is consequently less than the second input current.

A digital input is realized with the aforementioned solution which, with a large input voltage (30 V), "draws" as little current as possible (2 mA) so that the resulting power loss remains low and with a low voltage (11 V) "draws" more current (5.4 mA) so that the existing line capacity is discharged rapidly and signals with high switching frequencies can therefore be detected.

In an embodiment of the circuit arrangement, the semiconductor switching device comprises a first transistor with a collector, an emitter and a base, and the base is connected to the control input and the regulator includes a second transistor with a collector, an emitter and a base, where the base of the second transistor is connected to the collector of the first transistor via a voltage divider and the collector of the second transistor is connected to the control input.

Furthermore, it is advantageous if the reference voltage source is formed by a further voltage divider.

It is also an object to provide a peripheral module with a circuit arrangement in accordance with the disclosed embodiments.

In accordance with the invention disclosed embodiments, current limitation of the digital input is regulated depending on the voltage at the digital input such that the power loss remains as small as possible. The special effect is that with a low voltage at the digital input a large current is consumed at the digital input, and that with a high voltage at the digital input a low current is consumed. With this, the power loss at the digital input is maintained as low as possible with a high voltage, but also with this a high current is consumed with a low voltage at the digital input. With this low voltage and the high current, a power loss is therefore also in a low range. Overall, this results in line capacities being discharged relatively quickly as a result of the high current consumption and therefore signals from "high-side" signal transmitters can also be detected quickly.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

Hereinafter an exemplary embodiment of the invention is explained in more detail with reference to the diagrams. Corresponding objects and elements are given the same reference characters in all the figures, in which.

DETAILED DESCRIPTION OF THE EXEMPLARY EMBODIMENTS

Figure 1:
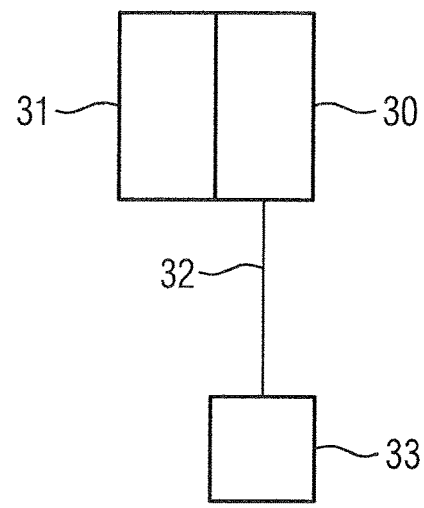
FIG. 1 shows a PLC system with a peripheral module and a connected signal transmitter.

FIG. 1 shows a Programmable Logic Controller (PLC) system with an automation device 31, a peripheral module 30 with a signal transmitter 33 connected via a connection cable 32. The signal transmitter 33 is connected to the peripheral module 30. The peripheral module 30 is configured as a digital input module. Due to its internal structure, the connection cable 32 has a certain capacity, e.g., 100 pF/m. With existing line capacities of the connected load, there is always the problem of discharging these line capacities, whereby any switching frequencies may be limited by signal transmitters. There are "rapid" digital input modules that can record switching frequencies of, e.g., 100 kHz. In principle, there are also two types of signal transmitters, i.e., a push-pull signal transmitter and a high-side signal transmitter.

Figure 2:
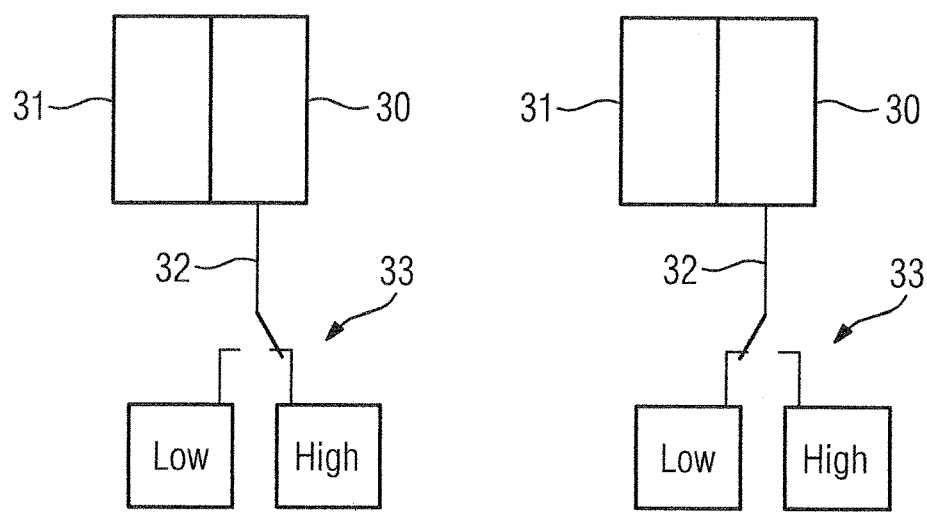
FIG. 2 shows a schematic of push-pull signal transmitters.

FIG. 2 shows a push-pull signal transmitter which, at a high level, outputs 24 V, for example, and at a low level 0 V, for example. The line capacity is actively charged and discharged both at a high level, and at a low level.

Figure 3:
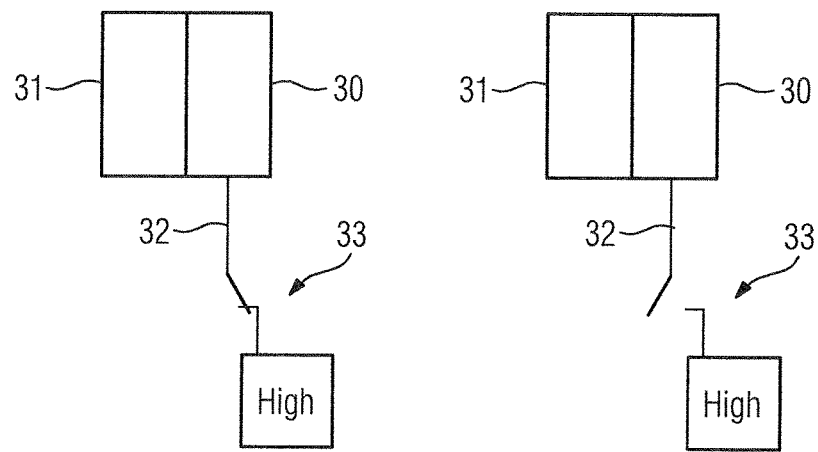
FIG. 3 shows the schematic of a high-side signal transmitter.

FIG. 3 shows a high-side signal transmitter. At a high level, the switch is closed and, for example, 24 V is output. At a low level the switch is open and "nothing" is output. The signal transmitter is high-impedance. The line capacity is actively charged in a change from low level to high level. In a change from high level to low level, the line capacity must be discharged via the digital input module. For digital inputs with a high current consumption, this occurs relatively quickly. For digital inputs with a low current consumption, this occurs slowly. This means that digital inputs with a low current consumption take a long time for the line capacity to be discharged to a low level. A maximum input frequency or switching frequency is consequently limited. The standard IEC 61131-2: 2007 describes three types of digital input: Type 1, Type 2 and Type 3. The following values are specified therein: Type 1: high level at $>=15$ V (current consumption $>=2$ mA), low level at $<=5$ Volt. Type 2: high level at $>=11$ V (current consumption $>=6$ mA), low level at $<=5$ V. Type 3: high level at $>=11$ V (current consumption $>=2$ mA), low level at $<=5$ V.

Here, the fundamental problem is clear again: Type 2 digital inputs consume 6 mA and therefore discharge the line capacity very quickly. With a 30 V input voltage, however, they produce a power loss of 30 V·6 mA=180 mV. In a peripheral module or a digital input module with 32 inputs this would be 32·180 mW=5.76 W. Conversely, Type 3 digital inputs only consume 2 mA, thus discharging the line capacity, but only very slowly. With a 30 V input voltage, type 3 digital inputs only produce a power loss of 30 V·2 mA=60 mW. In the case of a digital input module with 32 inputs this would only be 32·180 mW=1.92 W.

With the ever-diminishing dimensions of PLC systems or peripheral modules today, power losses like those occurring with Type 2 digital inputs are no longer dissipated. Type 3 digital inputs are therefore used. Thus, a digital input is realized in accordance with the invention that draws as little current as possible (2 mA) at a high voltage (30 V) so that the power loss remains low, and at a low voltage (11 V), more current (5.4 mA) so that the line capacity is also discharged rapidly and high switching frequencies are therefore possible.

Figure 4:
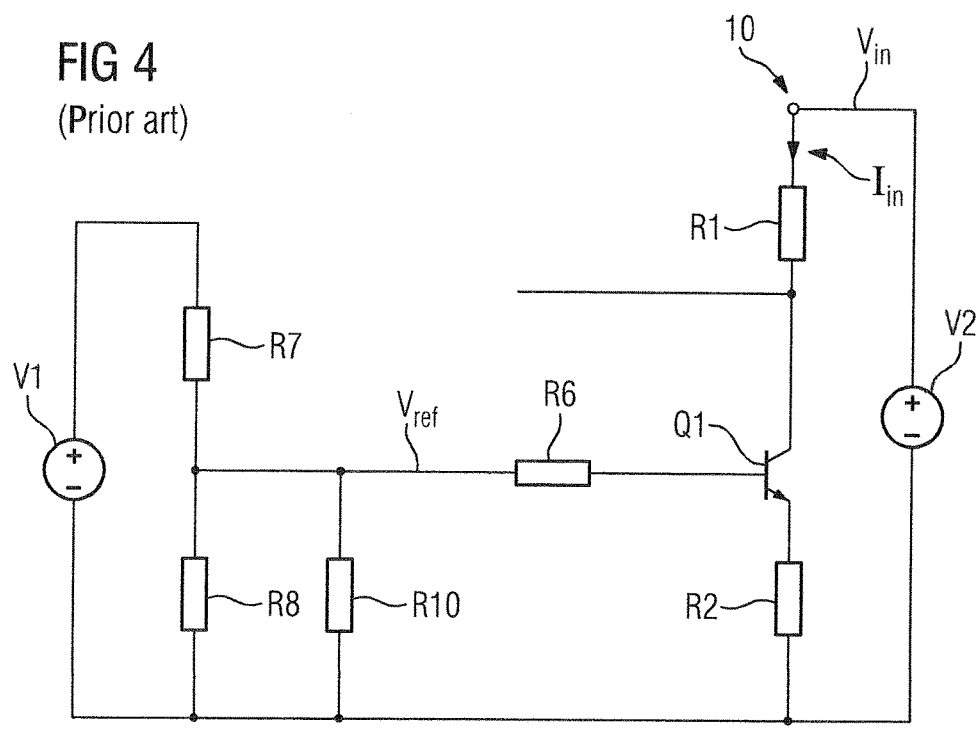
FIG. 4 shows a circuit arrangement for a digital input in accordance with the prior art.

FIG. 4 shows a circuit arrangement in accordance with the prior art. An input voltage $V_{in}$ is adjacent to an inlet connection 10. Via a voltage divider R7, R8, a reference voltage source $V_{Ref}$ is produced from a supply voltage V1. The reference voltage of the reference voltage source $V_{Ref}$ is above a resistance R6 at the base B1 of a first transistor Q1. A current limitation is reached with an emitter resistance R2. The dimensioning of the components is such, in the example shown in FIG. 4, that an input current I at the inlet connection 10 is limited to approx. 2 mA.

Figure 5:
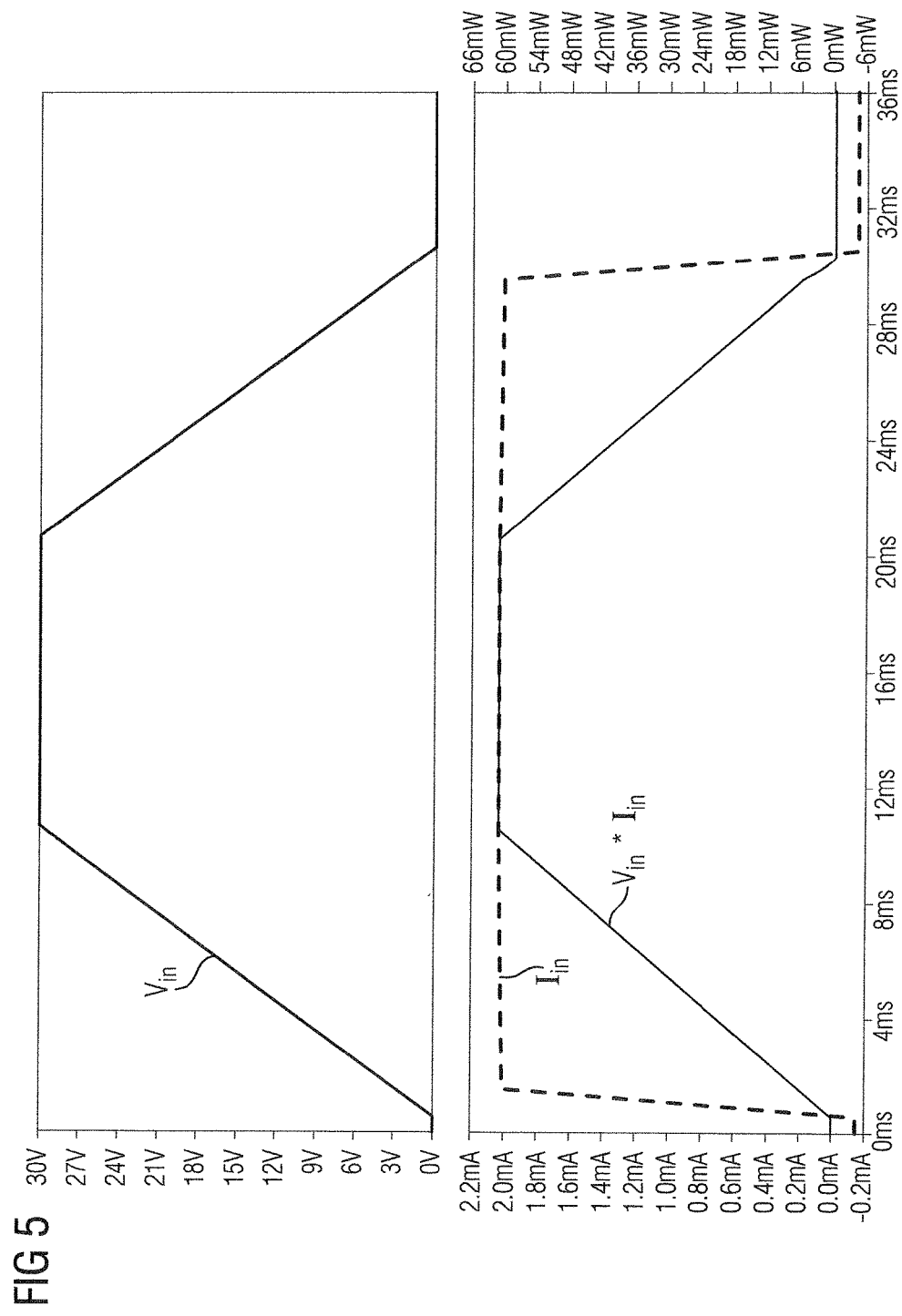
FIG. 5 shows graphical plots of the voltage and current curves of the circuit arrangement in accordance with the prior art.

FIG. 5 shows graphical plots of the signal curves of the current and voltage associated with FIG. 4. The input voltage $V_{in}$ is shown in the upper diagram. The input voltage $V_{in}$ increases from 0 V to 30 V and then again falls from 30 V to 0 V. The input current $I_{in}$ and the associated power loss $V_{in} \cdot I_{in}$ is shown in the lower diagram. A power loss of approx. 60 mW is obtained at 30 V for an input voltage $V_{in}$.

Figure 6:
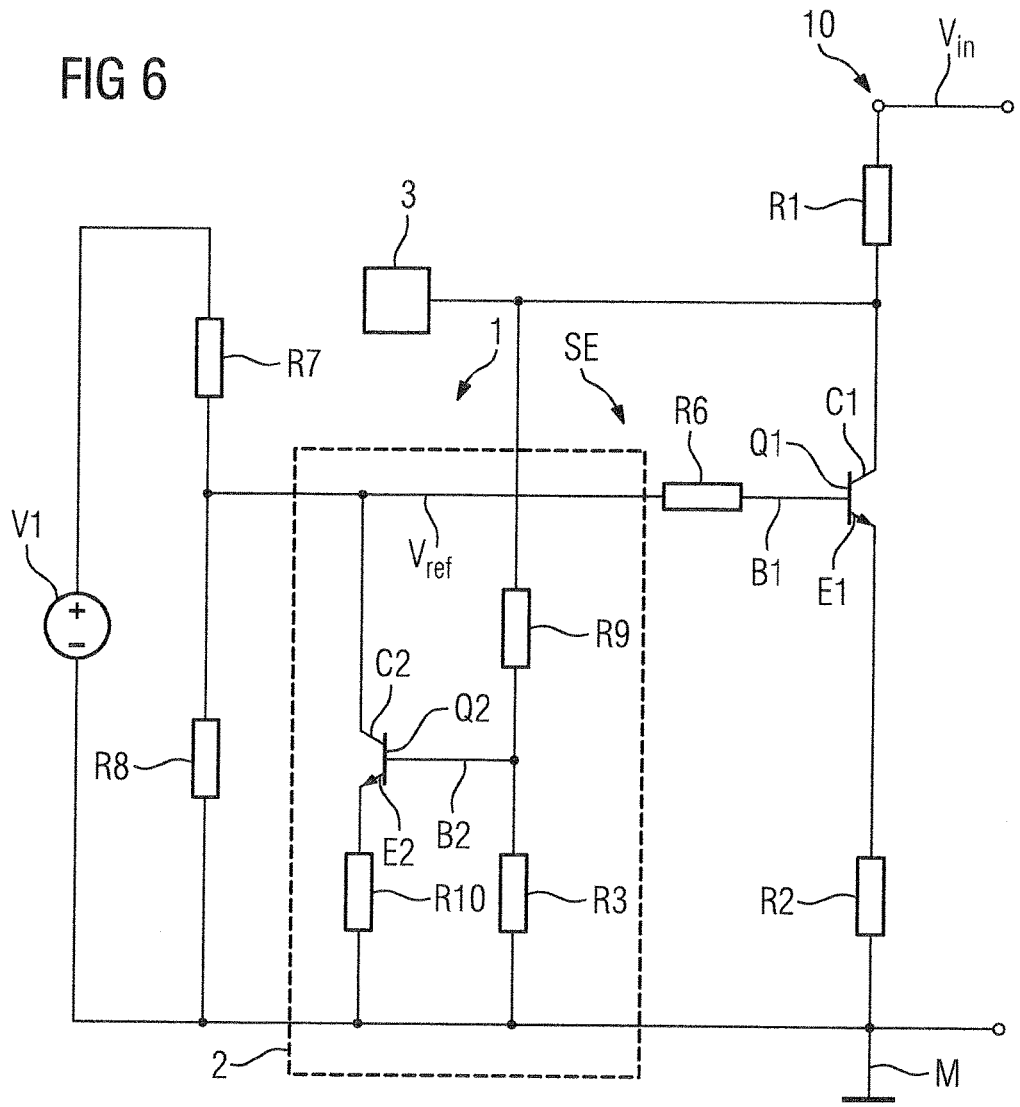
FIG. 6 shows the circuit arrangement in accordance with the invention.

FIG. 6 shows the enlarged circuit arrangement 1 with the regulator 2 in accordance with the invention. In addition, a second transistor Q2 was added to the circuit arrangement from FIG. 4. The second transistor Q2 is connected to the collector C1 of the first transistor Q1 via a further voltage divider R9, R3. The reference voltage of the reference voltage source $V_{Ref}$ is again produced via the voltage divider R7, R8. As soon as the second transistor Q2 is conductive, a parallel connection of the resistances R8 and R10 is increasingly achieved. The reference voltage of the reference voltage source $V_{Ref}$ is reduced thereby. The reduction of the reference voltage of the reference voltage source $V_{Ref}$ results in the collector current also being reduced by the first transistor Q1 due to the negative feedback with the emitter resistance R2 of the first transistor Q1. This means that the input current $I_{in}$ is automatically limited. With a low input voltage $V_{in}$, a high current is consumed via the inlet connection 10. With a high input voltage $V_{in}$, a low current is consumed.

Figure 7:
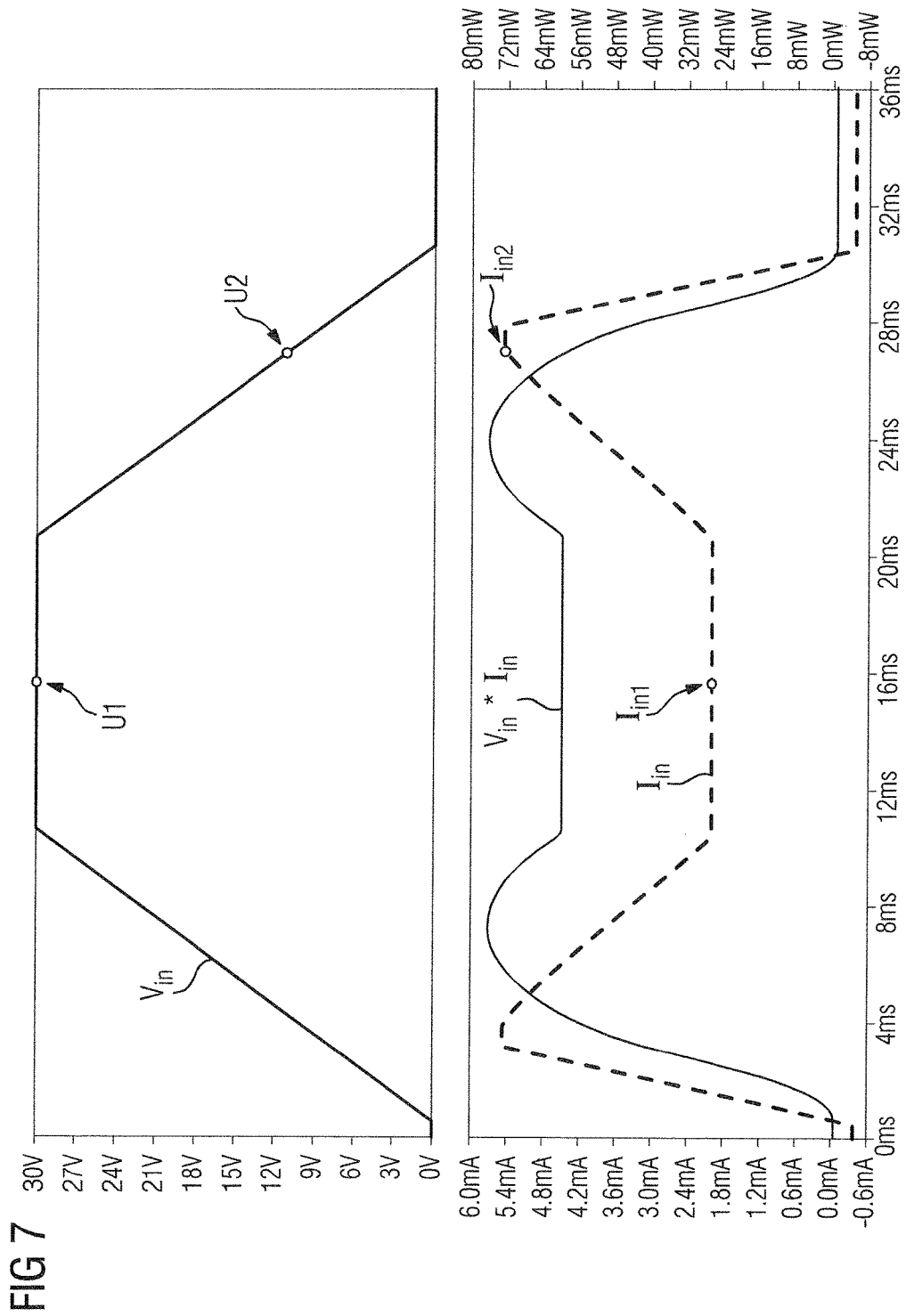
FIG. 7 shows graphical plots of the signal curves for the voltage and current of the circuit arrangement in accordance with the invention.

FIG. 7 shows graphical plots of the signal curves of the current and voltage in accordance with the circuit arrangement of FIG. 6. The input voltage $V_{in}$ is shown in the diagram above. The input voltage $V_{in}$ increases from 0 V to 30 V and then again declines from 30 V to 0 V. 30 V could correspond to a first voltage value U1 and, for example, approx. 10 V could correspond to a second voltage value U2. The lower diagram also shows the associated input current $I_{in}$ and the accruing power loss $V_{in} \cdot I_{in}$. The input current $I_{in}$ initially increases sharply with increasing input voltage $V_{in}$ (to approx. 5.4 mA) and is then regulated back to a first input current $I_{in2}$ (approx. 2 mA) with further increasing input voltage $V_{in}$. With an input voltage $V_{in}$ of approx. 30 V, a power loss of approx. 60 mW is again therefore obtained. If the input voltage $V_{in}$ again decreases from its maximum value 30 V, then the current is again regulated upwards, where it is possible to say that a first input current $I_{in}$ belongs to the first voltage value U1 and a second input current $I_{in2}$ to the second voltage value U2. Accordingly, the circuit arrangement of FIG. 6, where the encircled area shows the regulator 2, is regulated such that the first transistor Q1 with a first voltage value U1 for the input voltage $V_{in}$ adjusts the input current $I_{in}$ to a first input current $I_{in2}$ and with a second voltage value U2 for the input voltage $V_{in}$ adjusts the input current $I_{in}$ to a second input current $I_{in2}$, where the first voltage value U1 is greater than the second voltage value U2 and due to the regulator 2 the first input current $I_{in2}$ is consequently less than the second input current $I_{in2}$.

Figure 8:
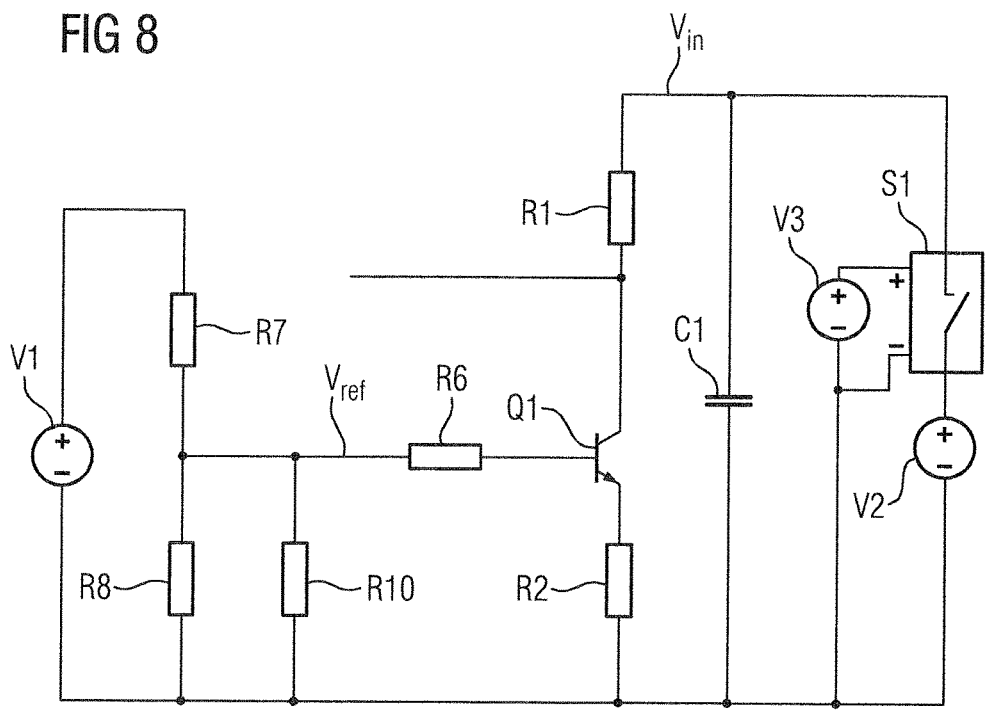
FIG. 8 shows a practical application.

According to FIG. 8, for clarification an application that simulates a line capacity C1 and a high-side switch S1, is connected to the circuit arrangement in accordance with the prior art. The line capacity C1 has, for example, a value of C1=1 nF. A voltage V2 (30 V) is connected via the high-side switch S1 and then switched off again. Switching off occurs as can be seen in the voltage curves of FIG. 9, at t=10.0 ms.

Figure 9:
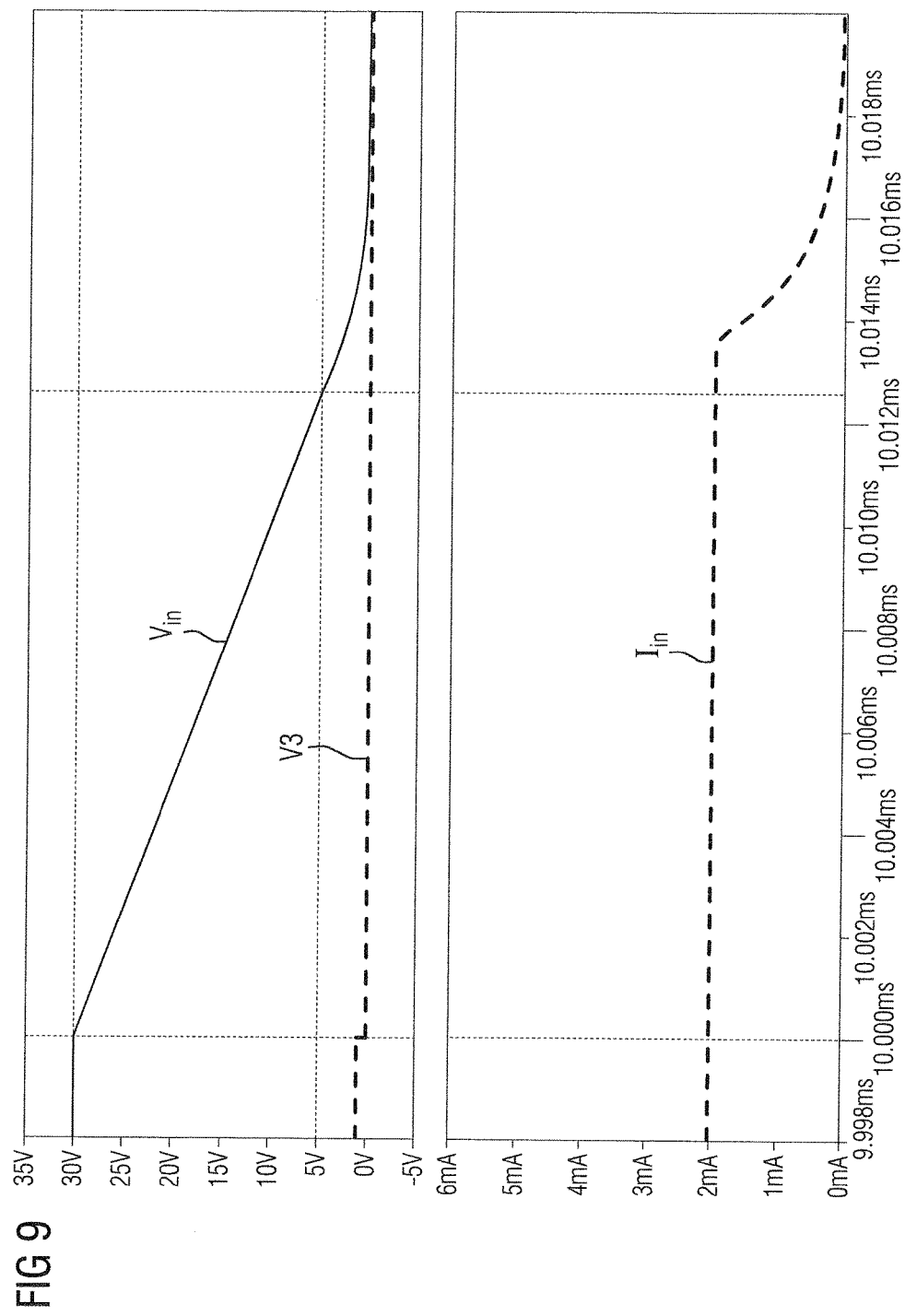
FIG. 9 shows graphical plots of the signal curves for a circuit arrangement in accordance with the prior art.

FIG. 9 therefore shows graphical plots of the signal curves for the current and voltage in a circuit arrangement in accordance with the prior art. At t=10.0 ms, the switch S1 is opened and in doing so the switching voltage V3 for the switch S1 moves to zero. In the upper diagram, it can be seen that the input voltage $V_{in}$ decreases approximately linearly as the capacitor C1 is discharged with a constant current of approximately 2 mA. If the input voltage $V_{in}$ has reached a value of 5 V, then the signal input can reliably detect a low level. The time until the input voltage $V_{in}$ has decreased from 30 V to 5 V is marked by the dotted lines and is approximately 12.6 μs. That is, the digital input only detects a low level approximately 12.6 μs after opening the switch S1.

Figure 10:
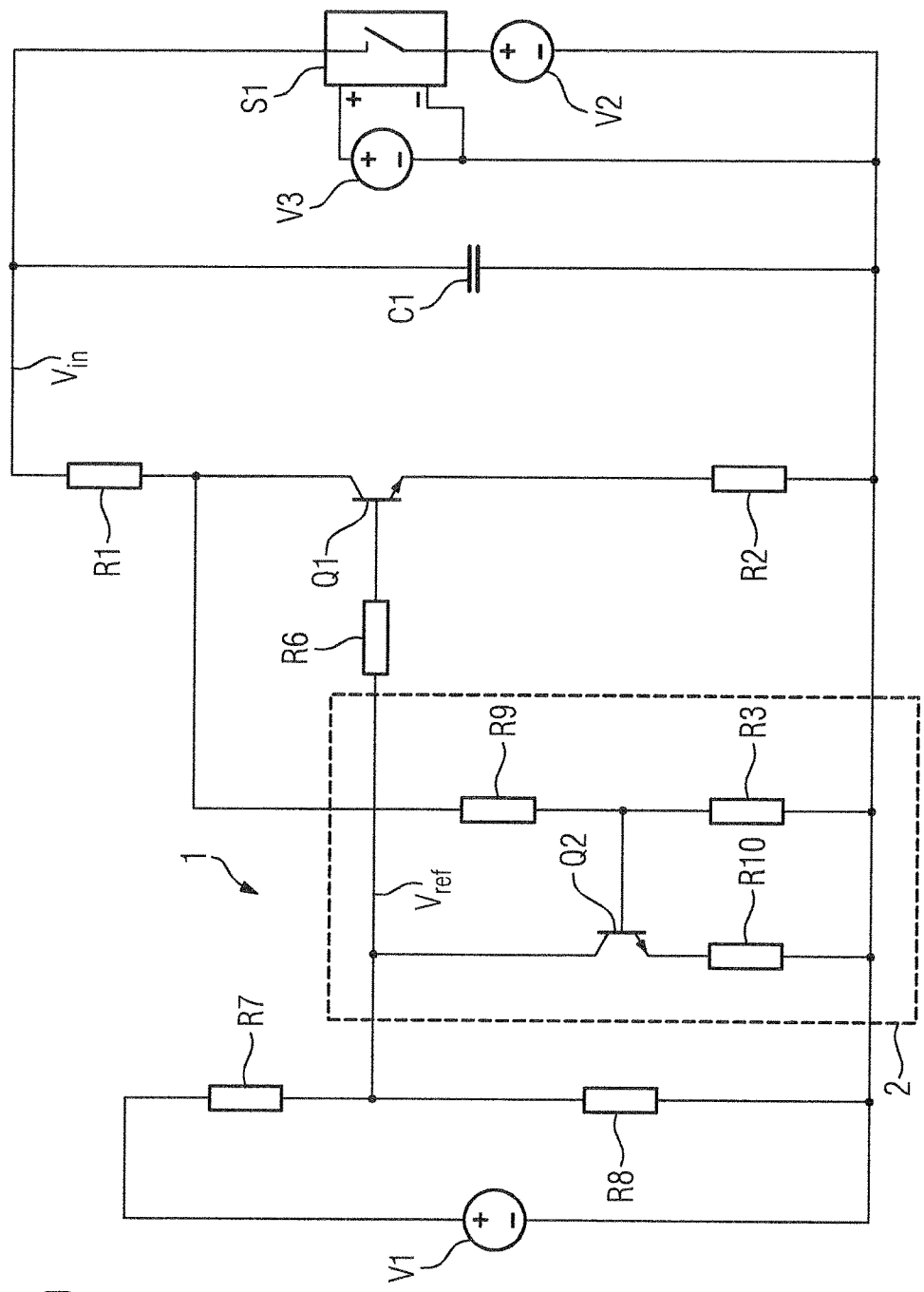
FIG. 10 shows the circuit arrangement with a practical application with regard to the line capacity.

To show the difference, as indicated via FIG. 10, the practical application is likewise performed on the circuit arrangement 1 in accordance with the invention. Now the circuit arrangement again shows the regulator 2. The line capacity of C1 is in turn arranged on the inlet connection 10. Via a high-side switch S1 the voltage V2 of 30 V is connected, the switch S1 is switched with a control voltage V3.

Figure 11:
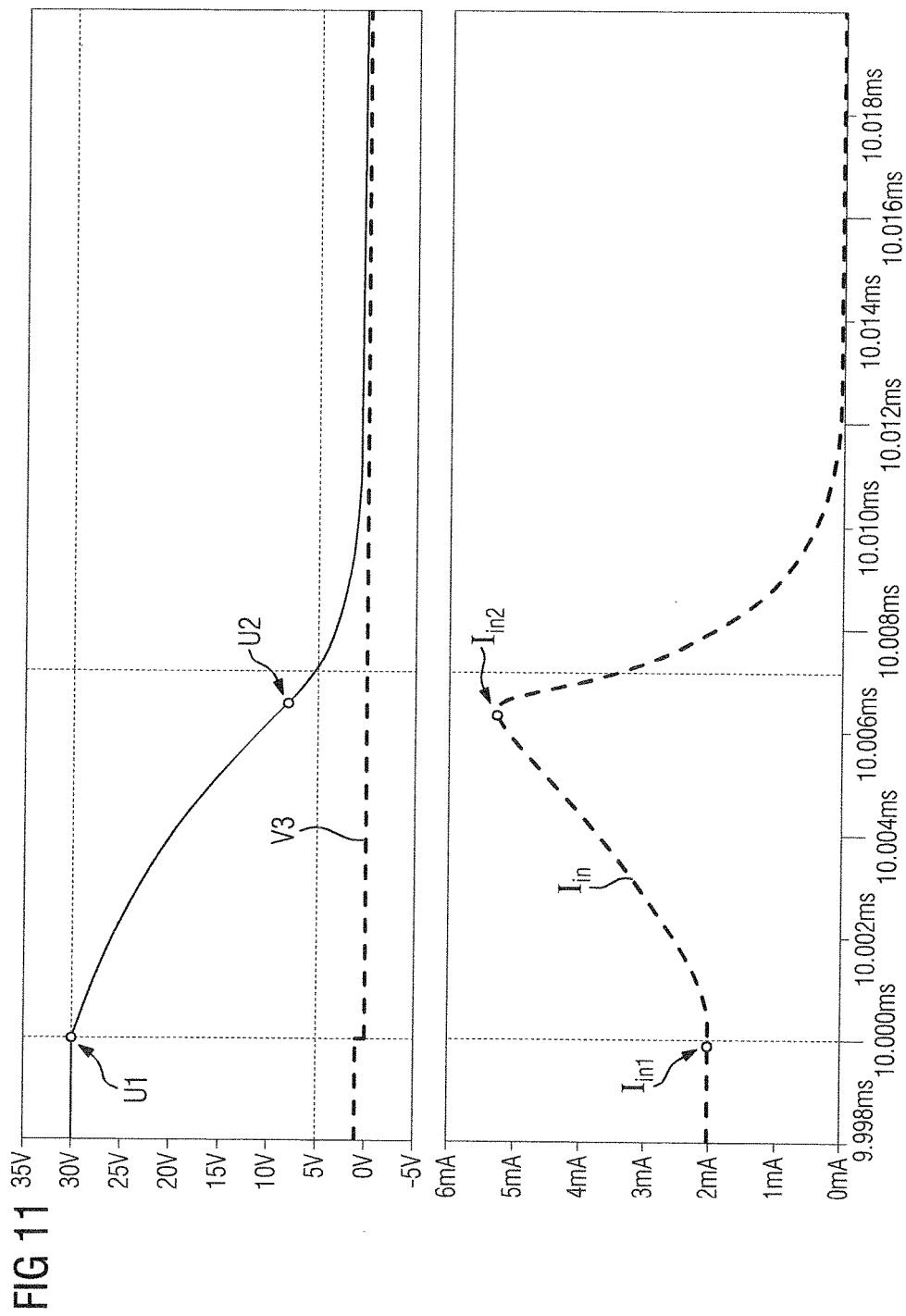
FIG. 11 shows the graphical plots of the signal curves for current and voltage with the circuit arrangement in accordance with the invention in the practical application.

FIG. 11 shows graphical plots of the signal curves in a real application of the circuit arrangement 1 in accordance with the invention. After switching off the switch S1 with the switching voltage V3, the input voltage $V_{in}$ decreases from a first voltage value U1=30 V to a second voltage value U2 of approximately 10 V. The input voltage $V_{in}$ now decreases increasingly sharply as the capacitor C1 is being discharged with an increasing current. Due to the regulator 2, after deactivation the input current $I_{in}$ initially increases rapidly from approx. 2 mA to approximately 5.4 mA. Through this increase due to regulation technology from the first input current $I_{in2}$ to the second input current $I_{in2}$, the line capacity C1 can be discharged more rapidly and after a short time likewise marked with dotted lines, from approx. 7.2 μs the digital input can reliably detect a low level. With the switching arrangement in accordance with the invention, a low level is therefore already detected after 7.2 μs instead of after 12.6 μs and thus, high switching frequencies can also be achieved with high-side signal transmitters.

As a rule, level detection (high level/low level) is realized with a comparator that records the input voltage $V_{in}$. In FIG. 6 a level detector 3 was delineated to clarify that such level detection naturally exists in principle.

Thus, while there have been shown, described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements which perform substantially the same function in substantially the same way to achieve the same results are within the scope of the invention. Moreover, it should be recognized that structures and/or elements shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:

1. A circuit arrangement for a digital input of an electronic peripheral module, comprising:
   an inlet connection forming a digital input;
   a ground connection;
   a semiconductor switching device arranged between the inlet connection and the ground connection, said semiconductor switching device limiting an input current;
   a reference voltage source connected to a control input of the semiconductor switching device to control the semiconductor switching device; and
   a regulator configured to regulate the reference voltage source depending on an input voltage at the inlet connection such that, for a first voltage value, the semiconductor switching device adjusts the input current for the input voltage to a first input current and, for a second voltage value, adjusts the first input current for the input voltage to a second input current;
   wherein the first voltage value is greater than the second voltage value and the first input current is less than the second input current on account of the regulator;
   wherein the semiconductor switching device comprises a first transistor with a collector, an emitter and a base, the base being connected to the control input, and the regulator including a second transistor with a collector, an emitter and a base, the base of the second transistor being connected to the collector of the first transistor via a voltage divider and the collector of the second transistor being connected to the control input; and
   wherein the electronic peripheral module includes a means for level detection which is connected to the inlet connection.

2. The circuit arrangement as claimed in claim 1, wherein the reference voltage source is formed by a further voltage divider.

3. A peripheral module for an automation device comprising:
   at least one inlet connection forming a digital input;
   a ground connection;
   a semiconductor switching device arranged between the at least one inlet connection and the ground connection, the semiconductor switching device limiting an input current;
   a reference voltage source connected to a control input of the semiconductor switching device to control the semiconductor switching device; and
   a regulator configured to regulate the reference voltage source depending on an input voltage at the inlet connection such that, for a first voltage value, the semiconductor switching device adjusts the input current for the input voltage to a first input current and, for a second voltage value, adjusts the input current for the input voltage to a second input current;
   wherein the first voltage value is greater than the second voltage value and on account of the regulator the first input current is less than the second input current;
   wherein the semiconductor switching device comprises a first transistor with a collector, an emitter and a base, the base being connected to the control input, and the regulator including a second transistor with a collector, an emitter and a base, the base of the second transistor being connected to the collector of the first transistor via a voltage divider and the collector of the second transistor being connected to the control input; and
   wherein the electronic peripheral module includes a means for level detection which is connected to the at least one inlet connection.

4. The peripheral module as claimed in claim 3, wherein the reference voltage source is formed by a further voltage divider.

5. The peripheral module as claimed in claim 3, wherein the first voltage value is greater than the second voltage value and the first input current is less than the second input current on account of the regulator.

6. A circuit arrangement for a digital input of an electronic peripheral module, comprising:
   an inlet connection forming a digital input;
   a means for level detection which is connected to the inlet connection;
   a ground connection;
   a semiconductor switching device arranged between the inlet connection and the ground connection, said semiconductor switching device limiting an input current;
   a reference voltage source connected to a control input of the semiconductor switching device to control the semiconductor switching device; and
   a regulator configured to regulate the reference voltage source depending on an input voltage at the inlet connection such that, for a first voltage value, the semiconductor switching device adjusts the input current for the input voltage to a first input current and, for a second voltage value, adjusts the first input current for the input voltage to a second input current;
   wherein the first voltage value is greater than the second voltage value and the first input current is less than the second input current on account of the regulator;
   wherein the reference voltage source is formed by a further voltage divider.

7. A peripheral module for an automation device comprising:
   at least one inlet connection forming a digital input;
   a means for level detection which is connected to the inlet connection;
   a ground connection;
   a semiconductor switching device arranged between the at least one inlet connection and the ground connection, the semiconductor switching device limiting an input current;
   a reference voltage source connected to a control input of the semiconductor switching device to control the semiconductor switching device; and
   a regulator configured to regulate the reference voltage source depending on an input voltage at the inlet connection such that, for a first voltage value, the semiconductor switching device adjusts the input current for the input voltage to a first input current and, for a second voltage value, adjusts the input current for the input voltage to a second input current;
   wherein the first voltage value is greater than the second voltage value and on account of the regulator the first input current is less than the second input current;
   wherein the reference voltage source is formed by a voltage divider.

* * * * *